United States Patent
Poletto et al.

[11] Patent Number: 6,037,826
[45] Date of Patent: Mar. 14, 2000

[54] CONTROL OF SATURATION OF INTEGRATED BIPOLAR TRANSISTORS

[75] Inventors: Vanni Poletto, Casale Monferrato; Marco Morelli, Milan, both of Italy

[73] Assignee: SGS-Thomson Microelectronics S.R.L., Agrate Brianza, Italy

[21] Appl. No.: 08/099,243

[22] Filed: Jul. 28, 1993

[30] Foreign Application Priority Data

Jul. 28, 1992 [EP] European Pat. Off. .............. 92830420

[51] Int. Cl.[7] ................................................. H03K 17/08
[52] U.S. Cl. ........................................... 327/375; 327/432
[58] Field of Search ..................................... 307/300, 270, 307/254; 327/375, 376, 377, 432, 492; 323/289

[56] References Cited

U.S. PATENT DOCUMENTS

| | | | |
|---|---|---|---|
| 4,055,794 | 10/1977 | Ickes et al. .............................. | 307/300 |
| 4,404,478 | 9/1983 | Rischmüller ............................. | 307/300 |
| 4,574,221 | 3/1986 | Hess et al. ............................... | 307/300 |
| 4,617,481 | 10/1986 | Masuda .................................... | 307/491 |
| 4,701,538 | 10/1987 | Marchiò et al. ......................... | 307/300 |
| 4,713,561 | 12/1987 | Yamada ................................... | 307/300 |
| 4,749,876 | 6/1988 | Gale et al. ................................ | 307/300 |
| 4,786,827 | 11/1988 | Gariboldi et al. ....................... | 307/300 |
| 5,017,802 | 5/1991 | Feldtkeller ............................... | 307/300 |
| 5,061,863 | 10/1991 | Mori et al. ............................... | 307/300 |
| 5,278,461 | 1/1994 | Bucksch et al. ......................... | 307/300 |

FOREIGN PATENT DOCUMENTS

| | | |
|---|---|---|
| 0251403 | 7/1988 | European Pat. Off. . |
| 2179218 | 2/1987 | United Kingdom . |

OTHER PUBLICATIONS

IBM Technical Disclosure Bulletin vol. 17, No. 4, Sep. 1974. "Dynamic Transistor Antisaturation Control" by K. H. Knickmeyer.

Patent Abstracts of Japan, vol. 9, No. 321 (E–367), Dec. 17, 1985.

Patent Abstracts of Japan, vol. 10, No. 248 (E–431), Aug. 16, 1986.

*Primary Examiner*—Tuan T. Lam
*Attorney, Agent, or Firm*—Theodore E. Galanthay; Allen, Dyer, Doppelt, Milbrath & Gilchrist, P.A.

[57] ABSTRACT

Saturation of a bipolar power transistor is controlled by sensing the current which is eventually injected into the substrate of the integrated circuit by the saturating transistor and using this signal for exerting a limiting action on the current which is driven to the base of the power transistor by a dedicated driving circuit. Unlike the prior art antisaturation systems, it is no longer necessary to precisely monitor the operating voltages across the terminals of the bipolar power transistor. A suitable sensing resistance may be integrated conveniently at a distance from the often complex integrated structure of the bipolar transistor. The system of the invention offers numerous advantages and ensures intervention of the antisaturation circuit only when the power transistor has positively reached a state of saturation, but well before any unwanted consequence.

22 Claims, 2 Drawing Sheets

CONTROL OF SATURATION OF INTEGRATED BIPOLAR TRANSISTORS

CROSS-REFERENCE TO RELATED APPLICATION

This application claims priority from European application 92830420.3, filed Jul. 28, 1992, which is hereby incorporated by reference.

BACKGROUND AND SUMMARY OF THE INVENTION

The present invention relates to a technique for controlling saturation of integrated bipolar transistors.

The saturation of an integrated bipolar transistor causes an injection of current into the substrate (which is commonly connected to ground). This effect of saturation, beside representing an undue power consumption, may also have other consequences, all highly undesirable. Of course the problem becomes severe in the case of power transistors, which are commonly driven through a base terminal by a driving circuit. The driving circuit may comprise an operational amplifier, to the inputs of which a control signal is fed.

A representative application of this type of circuit employing a power transistor is that of a so-called series voltage regulator. FIG. 1 is a functional schematic diagram of this common circuit wherein, in the particular instance, the power transistor is a PNP transistor. The operational amplifier OP drives the base of the power transistor T1 in function of a control signal fed to its inputs. In this specific instance, this signal represents a voltage difference between the regulated output voltage $V_L$ and a reference voltage $V_R$. When the $V_L$ voltage is lower than $V_R$, the OP amplifier increases the output current $I_B$ that, fed to the base of T1, forces the transistor to increase its collector current $I_L$, thus determining a desired increase of the output voltage $V_L$. Conversely, $V_L$ is greater than $V_R$, a reduction of the base current $I_B$ and therefore of the collector current $I_L$ and of the output voltage $V_L$ is obtained.

Of course there are physical limitations to the variation ranges within which such parameters may vary. In particular, by progressively reducing the input voltage $I_{IN}$, a condition is reached eventually whereby the difference of potential ($V_{CE}$) between the emitter and the collector of the power transistor T1, by dropping to a few hundred mV, brings the transistor to operate in a saturation region of its characteristic. Under these conditions of operation, the voltage regulator of FIG. 1, i.e. the bipolar transistor T1, ceases to provide a correct performance. In a regulator circuit as the one shown in FIG. 1, it becomes impossible to maintain an output voltage $V_L$ equal to the desired voltage $V_R$, because to an increase of the base current $I_B$ of the power transistor T1 no longer corresponds an increase of collector current. The operational amplifier OP, in an attempt of maintaining $V_L$ equal to $V_R$ increases its output current up to the maximum level of its intrinsic regulating capabilities. This last effect has in turn other negative influences when the power transistor T1 is an integrated transistor. In this case, the transistor has a "fourth terminal", commonly referred to as the substrate terminal (schematically indicated with "S" in FIG. 1) which, for obvious reasons, should be kept at the lowest potential present in the integrated circuit (typically to ground potential). The negative effects caused by the saturation of an integrated power transistor T1 are essentially connected with the generation of a current $I_S$ through the substrate terminal, which is related to the base current $I_B$ by a gain factor. Therefore this current $I_S$, which is injected in the substrate of the integrated circuit, is generally rather high, by considering that already the base current $I_B$ tends to be high under saturation conditions.

A saturating transistor may even invert the sign of its own collector's current if any component connected thereto can sustain it. As a consequence the current $I_L$ may flow into the collector of the power transistor T1. The presence of an inductive load (L) is a typical situation wherein an inversion of the collector's current may occur. In other circumstances, large capacitances are often connected in parallel to the load of a voltage regulator for obvious reasons. One reason may be the need of sustaining a certain current through the load also during brief interruptions of power supply to the regulator circuit. Therefore, under the above noted conditions of saturation, these "storage" capacitors may deliver a current ($-I_L$) to the collector of a saturating power transistor, thus unduly losing stored electrical charge and reducing the time of "self-sustainment" of the current through the load in case of interruption of the power supply.

The substrate current $I_S$ should be added to the base current $I_B$ of the power transistor T1 for determining the sum of the emitter and collector currents, according to the relation: $I_S+I_B=I_{IN}-I_L$. As a consequence, a large value of the sum: $I_S+I_B$, determines a large "input" current $I_{IN}$, as well as a high discharge current ($-I_L$) of a load capacitance. Both these currents are highly undesirable because they may overload the current path, cause undue power dissipation and eventually reduce the period of interruption of the power supply that the powered circuits may tolerate before losing their functional ability.

Several devices are known for controlling saturation of an integrated bipolar transistor with the aim of relieving or preventing the above-noted consequences. An antisaturation circuit that is commonly used according to a known technique is schematically shown in FIG. 2. The transistor T2, which is in an OFF condition during normal operation of the circuit, switches ON when the voltage between the collector and the base of the power transistor T1 becomes equal to the threshold (base/emitter) voltage of T2. The current flowing through T2 is then used for reducing or switching OFF the output current of the operational amplifier OP which drives the base of T2. In this manner the problems caused by an uncontrolled increase of such a driving current when the power transistor T1 enters saturation are contained.

Basically, the principle on which the operation of these known antisaturation circuits rests is that a transistor may be defined to be working in saturation conditions when its collector/base junction is directly biased. The base/emitter junction of the antisaturation transistor T2 is connected in parallel to the collector/base junction of the power transistor and therefore the transistor T2 begins to conduct when such a collector/base junction of the saturating power transistors becomes directly biased.

This well known solution, though producing a satisfactory control of saturation, is not devoid of drawbacks. In view of the fact that the power transistor T1 generally carries relatively high currents, there may be voltage drops along the connection between its collector terminal and the output terminal (OUT). In order to prevent such voltage drops from falsifying the voltage "read" by the emitter of T2, this transistor must be physically located very close to the collector terminal of T1 (to minimize the length of the connection). This is not always easy to realize in the case of an integrated power transistor because such a device has already a relatively complex system of connections. The structure of the base terminal of T1 may present similar problems of layout (though somewhat simpler because the current $I_B$ is at least an order of magnitude lower than $I_L$).

In general, according to the prior art, control of saturation is implemented by acting upon the cause of such a current, i.e. the occurrence of a directly biasing voltage ($V_{BC}$) across the collector/base junction. However, it is also necessary to ensure that the current $I_S$ does not rise above a certain maximum value. For this reason, under critical working conditions and/or in presence of critical intrinsic physical parameters of a particular fabrication process, it is necessary to adjust the intervention threshold of T2 with a certain safety margin and in many occasions the power transistor T1 may be in a condition which is not yet of true saturation when the antisaturation circuit intervenes. A not yet saturated T1 imposes a lower limit ($V_{CEmin}$) to the difference between emitter and collector potential which is higher than what would be ideally necessary for eliminating the negative effects of saturation of the power transistor, as noted above. A higher $V_{CEmin}$ voltage (as required by safety margin considerations) may have a remarkable importance, as in the case of a voltage regulator, because in turn it imposes a lower limit to the input voltage $V_{IN}$ during operation. In fact, it may be observed from FIG. 2, that $V_{INmin}=V_{CEmin}+V_R$. In order to ensure the lowest $V_{INmin}$ as possible, it would be desirable that the equality: $V_{CEmin}=V_{CEsat}$ be always verified, wherein $V_{CEsat}$ is the $V_{CE}$ of the power transistor T1 under mild (initial) saturation conditions, which would not yet cause the above-noted consequences.

On the other hand, fast transients may occur while the $V_{IN}$ voltage is within a normal working range for which the antisaturation transistor T2 should not intervene. Such transients propagate to the base of the power transistor T1 because its $V_{BE}$ is approximately constant. From this point, through the parasitic capacitance that exists between the collector and the base of the antisaturation transistor T2, the transients reach the collector of T2, which is connected to a high sensitivity input node of the driving operational amplifier OP. As said above, such an input signal modulates the output current, i.e. $I_B$, which in turn acts upon $I_L$ and eventually on $V_L$. In conclusion, the presence of the antisaturation transistor T2, with its parasitic capacitances, worsens the overall performance of the circuit in presence of fast transients on the supply lines. In many applications this aspect becomes very important because of the consequences that may ensue therefrom.

According to the disclosed innovations, the current injected into the substrate by a saturating transistor is used as information for exerting a limiting control of saturation. The present invention advantageously provides a system for controlling the saturation of an integrated bipolar power transistor, which may be easily implemented independently of the layout of the power transistor and wherein the control on saturation is readily adjustable in order to intervene when a certain tolerable level of saturation is surpassed.

It is a further object of the present invention to provide an improved voltage regulator circuit, having a low voltage drop and utilizing a bipolar power transistor as a series regulating element, driven by an operational amplifier, and provided with an improved circuit arrangement for controlling saturation of the power transistor used as series regulator.

Basically, the antisaturation system of the present invention, differently from the known systems, does not monitor the occurrence of a direct biasing of the collector/base junction of the power transistor as an indication of a saturation condition of the transistor. Instead, the system of the invention monitors a substrate current which is actually caused by the operation of the transistor in a saturation region of its characteristic. This is implemented by connecting a sensing resistance, generally of a small value, in the connection path between the substrate terminal of the power transistor and a ground node of the integrated circuit. The current which is eventually injected into the substrate by the power transistor when operating in a saturation condition, determines a certain voltage drop across the sensing resistance and this voltage is used as a signal confirming a certain saturation state. This voltage is compared with a reference voltage, for example by the use of an operational amplifier capable of generating an output current that is fed to an input of the driving circuit of the power transistor in order to exert a desired control on the saturation.

According to the system of the invention, it is no longer necessary to "disturb" the geometry of an integrated power transistor because it is no longer necessary to detect, as done in the known circuits, an "internal" operating voltage of the integrated transistor. An information in the form of a substrate current is not altered by the length (resistance) of the connection path between the substrate of the transistor and a sensing resistance, which advantageously may be physically realized far away from the integrated structure of the power transistor.

A corrective (limiting) action on saturation is effected by modifying the driving base current of the saturating power transistor, similarly to what is done in an antisaturation system of the prior art. By contrast, instead of monitoring the parameters or the parameter which causes saturation of the power transistor (i.e. its $V_{BC}$), a physical effect of saturation, that is the current which is injected into the substrate, is monitored instead.

In this way it is possible to limit very precisely the degree of saturation, by adjusting the triggering threshold of a comparator. The power transistor is permitted to reach a certain predetermined tolerable level of saturation, irrespective of the working conditions and/or of the spread of electrical parameters typical of the particular large-scale fabrication process. In this manner, a very useful condition: $V_{CEmin}=V_{CEsat}$, wherein $V_{CEsat}$ can be extremely small, may be ensured, because the operating conditions of the power transistor are corrected only when strictly necessary to avoid undesirable consequences.

In the case of a typical application such as that of a series voltage regulator, transients which may occur in the input line $V_{IN}$ are not propagated to the inputs of the comparator which controls saturation, nor to the output node, and therefore the antisaturation circuit of the invention does not modify in any way the behavior of the voltage regulator in presence of transients.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
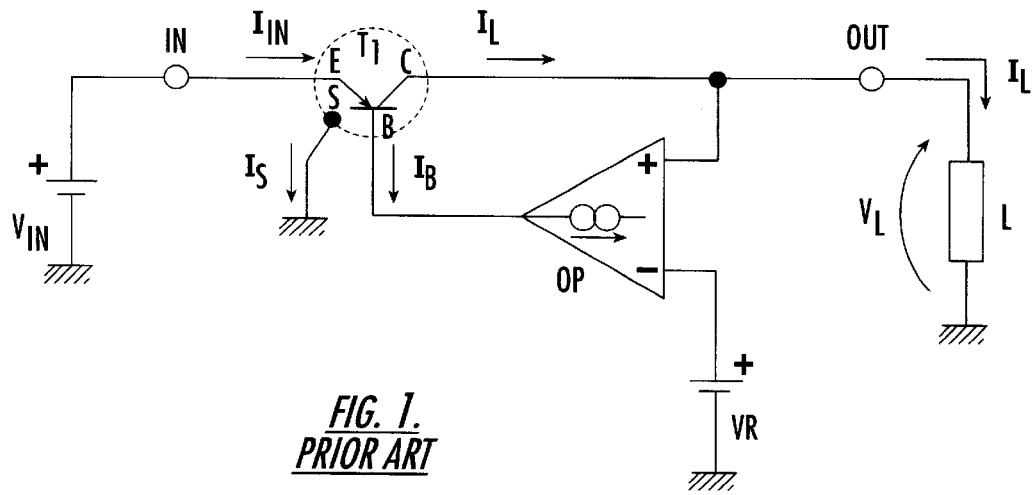
FIG. 1 is a functional diagram of a low-drop voltage regulator utilizing as regulating element a PNP power transistor, as described above.
Figure 2:
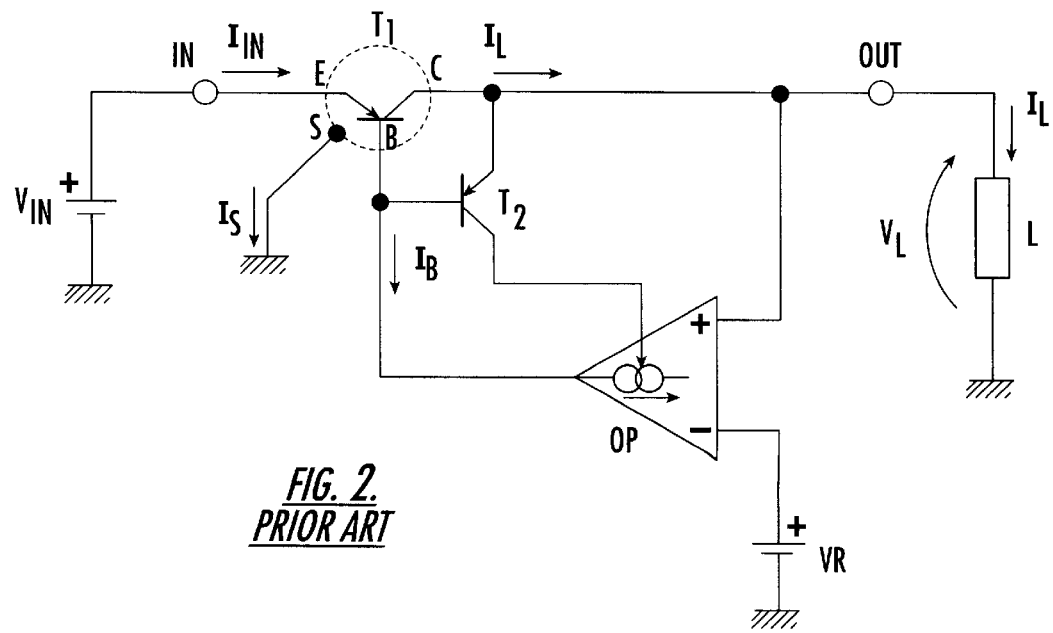
FIG. 2 is a basic circuit diagram of a low-drop series regulator according to FIG. 1, provided with a known antisaturation circuit, as described above.
Figure 3:
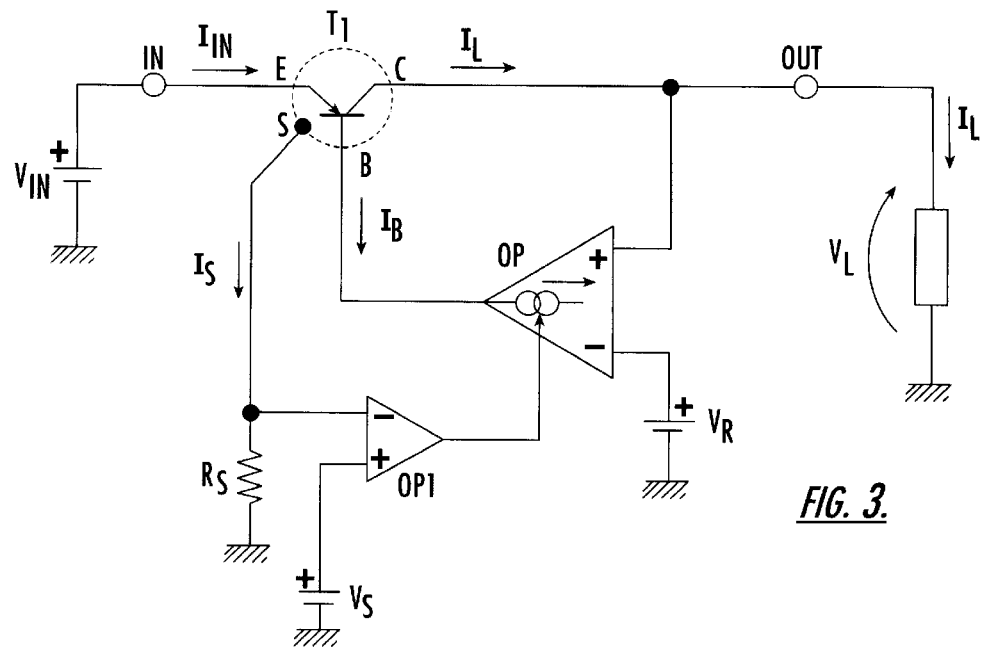
FIG. 3 is a basic diagram of a circuit for controlling saturation, made in accordance with the present invention.

With reference to the basic diagram of FIG. 3, the circuit for controlling the saturation of the power transistor T1 is composed of a sensing resistance $R_S$, a differential amplifier OP1 and a source of a reference voltage $V_S$.

The current $I_S$, which is injected into the substrate by the transistor T1 when it operates in a saturation region of its characteristic, determines a certain voltage drop across the sensing resistance $R_S$, which is compared by the operational amplifier OP1 (comparator) with the reference voltage $V_S$. When the voltage drop across $R_S$ is greater than $V_S$, the amplifier OP1 generates an output current that is fed to an input of the operational amplifier OP. As a consequence, the OP that drives the power transistor T1 reduces the driving current $I_B$ and therefore the substrate current $I_S$, which is injected into the substrate by the saturating transistor, is reduced. This current reduction process stops when the substrate current $I_S$ drops below a threshold value ($V_S/R_S$).

Figure 4:
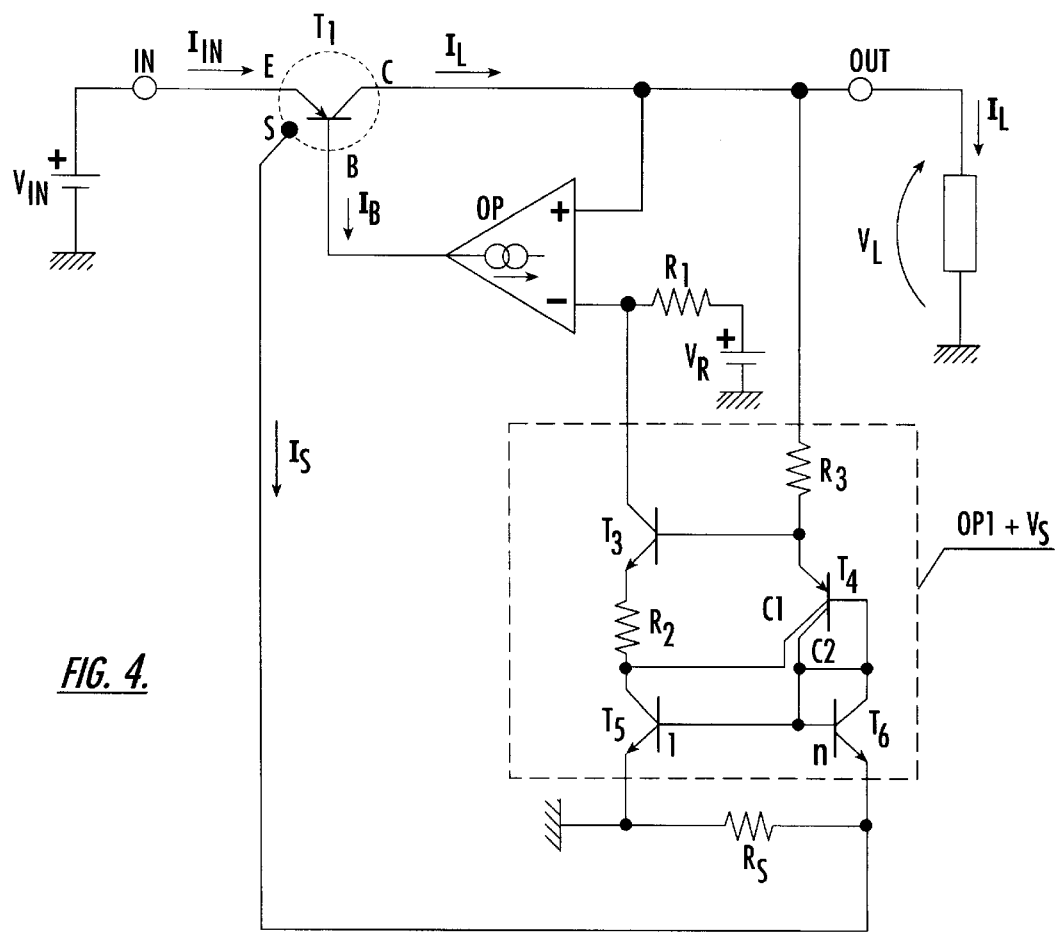
FIG. 4 is a more detailed embodiment of the circuit of FIG. 3.

A practical embodiment of an antisaturation circuit of the invention is shown in FIG. 4. Functionally, the emitter of the transistor T6 coincides with the inverting input (−) of the differential amplifier OP1. The emitter of the transistor coincides with a reference voltage node, while the noninverting (+) input of the OP1 amplifier is functionally incorporated in the integrated structure of the pair of input transistors T5 and T6. The collector of the transistor T3 represents the output node of the amplifier OP1, which in the example shown is not connected to a dedicated control input of the driving amplifier OP but to an inverting input (−) thereof. In practice, the output signal that is produced by the amplifier OP1 does not exert a direct control on the output current $I_B$ of the driving amplifier OP, but has a substantially equivalent effect by modifying the reference voltage $V_R$ which is actually applied to the inverting input (−) of the driving amplifier OP. The OP1+$V_S$ circuit is powered through the resistance R3 by deriving a supply current from the output node of the voltage regulator.

The operation of the antisaturation circuit OP1+$V_S$ of FIG. 4 is as follows. The current flowing through the resistance R3 is injected into the emitter of the PNP transistor T4. This transistor splits the current in two portions (between its collectors C1 and C2). A first portion of this current enters the collector region of the transistor T5 and a second portion enters the collector region of the transistor T6. The transistors T5 and T6 have a common base and the emitter area of T6 is n times the emitter area of the transistor T5. In this way a voltage difference is produced between the two emitters, given by: $V_T*\ln(n*I_{c6}/I_{c5})$, where $V_T=K*T/q$, where K=Boltzmann's constant, T=absolute temperature, q=charge of the electron, $I_{c6}$=current through T6, $I_{c5}$=current through T5. If the two collectors C1 and C2 of the transistor T4 are made so as to divide the current into equal parts ($I_{c5}=I_{c6}$), such a voltage difference becomes equal to $V_T*\ln(n)$. By assuming for example n=3 and a temperature of 27° C., such a voltage difference will be about 30 mV. This voltage constitutes the reference voltage $V_S$ of FIG. 3. In fact, if the voltage across $R_S$ becomes greater than the above-determined threshold voltage, the current $I_{c5}$ becomes greater than $I_{c6}$ which by contrast is always equal to the current through the collector C1 of the transistor T4. The difference current between these two currents flows through R2 and the transistor T3 and through the resistance R1, which is connected in series with the voltage reference $V_R$ of the driving amplifier of the power transistor T1. This current, by flowing through R1, determines a lowering of the reference voltage as seen by the voltage regulator, which consequently reduces the output voltage $V_R$ and therefore brings the power transistor T1 out of saturation. The resistance R2 has the purpose of placing an upper limit to the current flowing through the transistor T3. In fact, when the transistor T5 is at peak conduction and its collector's voltage reaches the voltage present on its emitter, the voltage drop across R2 becomes: $V_{BET6}+V_{BET4}-V_{BET3} \approx V_{BE}$. As a consequence, the above-noted upper limit of the current flowing through the transistor T3 becomes: $V_{BE}/R2$.

The sensing resistance $R_S$ may be implemented, for example, by a metal connection which is electrially in parallel with the resistance of a portion of the substrate.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

Thus, it is not strictly necessary that absolutely all of the substrate current must pass directly through the sensing resistance.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit, comprising:
   a bipolar transistor connected to pass current between an emitter and a collector thereof in accordance with a base current applied at a base thereof;
   a first amplifier connected to control said base current to maintain said collector current at an instantaneously desired value; and
   a second amplifier operatively connected to receive an input indicating the magnitude of substrate current from said transistor, and also connected, with said first amplifier, to reduce said base current, regardless of the relation of said collector current to said desired value, whenever said substrate current exceeds a threshold value.

2. The integrated circuit of claim 1, wherein said bipolar transistor is a power transistor.

3. The integrated circuit of claim 1, wherein said bipolar transistor is a PNP transistor.

4. The integrated circuit of claim 1, wherein said threshold value is a predetermined constant value.

5. The integrated circuit of claim 1, wherein said second amplifier is operatively connected to receive said input from a sensing resistance which comprises a portion of metal line which is paralleled with a portion of said substrate.

6. The integrated circuit of claim 1, wherein said desired value of current at said collector is strictly dependent on the voltage of said collector.

7. An integrated circuit, comprising:
   a power bipolar transistor connected to pass current between an emitter and a collector thereof in accordance with a base current applied at a base thereof;
   a first amplifier connected to control said base current to maintain said collector current at an instantaneously desired value;
   a sensing resistor operatively connected to pass a current which corresponds to the substrate current of said transistor; and
   a second amplifier operatively connected to detect the voltage across said sensing resistor, and also connected to cause said first amplifier to reduce said base current, regardless of the relation of said collector current to said desired value, whenever said substrate current exceeds a threshold value.

8. The integrated circuit of claim 7, wherein said bipolar transistor is a power transistor.

9. The integrated circuit of claim 7, wherein said bipolar transistor is a PNP transistor.

10. The integrated circuit of claim 7, wherein said threshold value is a predetermined constant value.

11. The integrated circuit of claim 7, wherein said sensing resistor comprises a portion of metal line which is paralleled with a portion of said substrate.

12. The integrated circuit of claim 7, wherein said desired value of current at said collector is strictly dependent on the voltage of said collector.

13. An antisaturation circuit for an integrated bipolar transistor, comprising:
   a sensing resistance functionally connected between a substrate region of said integrated transistor and a ground node of the integrated circuit;
   a comparison circuit having a first input functionally connected to said sensing resistance, a second input functionally connected to a reference voltage and an output connected to a control terminal of a driving circuit which is connected to drive the integrated bipolar transistor;
   said comparison circuit producing an amplified signal in function of a signal present across said sensing resistance, through which a substrate current generated by said integrated transistor when operating in a saturation region of its characteristic, when the signal present across said sensing resistance becomes greater than said reference voltage.

14. The circuit of claim 13, wherein said bipolar transistor is a power transistor.

15. The circuit of claim 13, wherein said bipolar transistor is a PNP transistor.

16. The circuit of claim 13, wherein said reference voltage is constant.

17. The circuit of claim 13, wherein said sensing resistance comprises a portion of metal line which is paralleled with a portion of said substrate.

18. A method for controlling saturation of an integrated circuit bipolar transistor in a semiconducting substrate, comprising the steps of:
   providing base current, at a base terminal of said transistor, to achieve a desired current flow between an emitter terminal of said transistor and a collector terminal of said transistor;
   continually monitoring substrate current, which flows between said transistor and said substrate; and
   reducing said base current whenever said substrate current exceeds a predetermined minimum.

19. The method of claim 18, wherein said step of continually monitoring uses a sensing resistance which comprises a portion of metal line which is paralleled with a portion of said substrate.

20. A method for controlling saturation of a bipolar transistor integrated in a semiconducting substrate of an integrated circuit for limiting the current which is injected into the substrate by the saturating transistor, by controlling a driving current fed to a base of the integrated transistor in function of a signal representative of the state of saturation of the transistor, which comprises
   sensing across a sensing resistance through which said substrate current flows a first signal representative of a saturation condition of said integrated transistor;
   comparing said first signal with a reference voltage;
   generating a second amplified signal corresponding to said first signal when said first signal becomes greater than a threshold established by said reference voltage; and
   feeding said second amplified signal to a control terminal of a driving circuit for modifying said driving current.

21. The method of claim 20, wherein said sensing resistance comprises a portion of metal line which is paralleled with a portion of said substrate.

22. A voltage regulator circuit utilizing as a series regulator an integrated bipolar transistor having an emitter functionally connected to an input node and a collector functionally connected to an output node of the voltage regulator circuit, a base connected to an output of an operational amplifier having a noninverting input connected to said output node of the circuit and an inverting input connected to a first reference voltage and a substrate region connected to ground potential, comprising
   a sensing resistance functionally connected between said substrate region and a ground node of the integrated circuit;
   a comparator having a first input connected to said sensing resistance, a second input connected to a second reference voltage and an output connected to a control node of said operational amplifier;
   said comparator generating an amplified signal in function of a signal present across said sensing resistance when it becomes greater than a threshold value established by said second reference voltage, said amplified signal being applied to said control node of said operational amplifier for reducing a driving current fed to the base of said integrated transistor for limiting saturation thereof.

* * * * *